Jan. 7, 1958 S. L. REICHES 2,819,391

SUPERHETERODYNE TUNER WITH IMAGE FREQUENCY TRAYS WHICH TRACKS WITH LOCAL OSCILLATOR AND ANTENNA RESONATORS

Filed March 25, 1954 2 Sheets-Sheet 1

Inventor
Sol L. Reiches by Hill, Sherman, Meroni, Gross & Simpson
Attys.

SUPERHETERODYNE TUNER WITH IMAGE FREQUENCY TRAYS WHICH TRACKS WITH LOCAL OSCILLATOR AND ANTENNA RESONATORS

Filed March 25, 1954 2 Sheets-Sheet 2

Inventor
Sol L. Reiches by Hill, Sherman, Meroni, Gross & Simpson
Attys

United States Patent Office 2,819,391

Patented Jan. 7, 1958

2,819,391

SUPERHETERODYNE TUNER WITH IMAGE FREQUENCY TRAYS WHICH TRACKS WITH LOCAL OSCILLATOR AND ANTENNA RESONATORS

Sol L. Reiches, Cleveland, Ohio

Application March 25, 1954, Serial No. 418,507

2 Claims. (Cl. 250—20)

Figure 1:
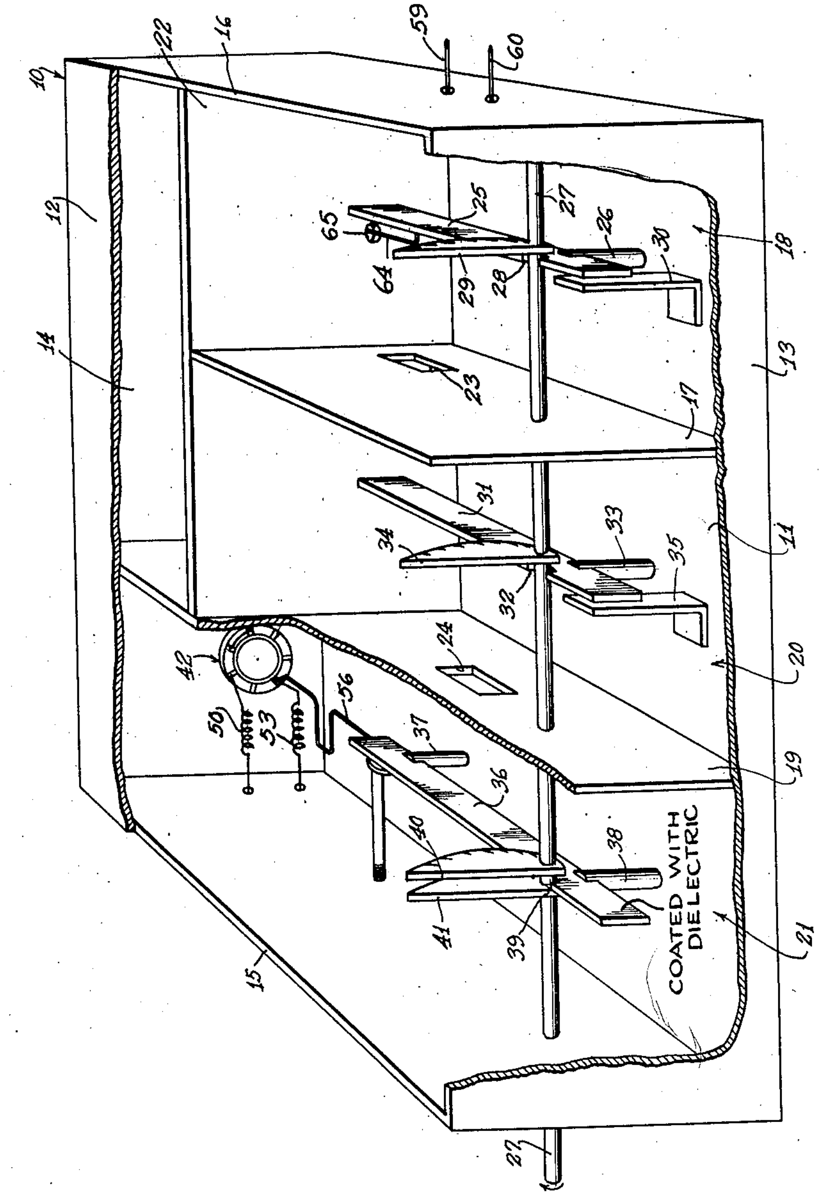

This invention relates to a high frequency tuner of the type operating on the superheterodyne principle in which the output of a resonant signal section tuned to the signal frequency, that is, the frequency of signals which it is desired to receive, and the output of an oscillator section tuned to the signal frequency plus or minus a predetermined frequency are applied to a non-linear element generally referred to as a mixer or first detector to generate a "beat" frequency equal to such predetermined frequency which may be readily amplified by an amplifier permanently tuned to such predetermined frequency. This predetermined frequency is generally referred to as the "intermediate" frequency, abbreviated as "I. F."

This invention was evolved with the object of providing a practical solution to special problems encountered in the construction of such tuners to operate at frequencies of 100 megacycles and higher and particularly in the range of frequencies of from 470–890 megacycles now comprising the ultra high frequency (UHF) television band.

In particular, the problems involved with image rejection are greatly increased at the high frequencies under consideration. An "image" is an undesired signal at a frequency referred to as the "image frequency" which is equal to the signal frequency plus or minus twice the intermediate frequency (depending upon whether the oscillator is operated at a frequency above or below the signal frequency) which can beat with the oscillator frequency to produce a signal at the intermediate frequency.

It is desirable that the intermediate frequency should be as low as possible, preferably less than 50 megacycles and in this connection it may be noted that the very purpose of the superheterodyne system is to reduce the signal frequency to a much lower frequency which can be readily amplified. At the frequencies under consideration, the intermediate frequency becomes a comparatively small proportion of the signal frequency so that, percentage-wise, the image frequency is very close to the signal frequency and the selectivity required to reject the image frequency is greatly increased. Also, oscillator frequency, being comparatively close to the signal frequency, can be more effectively transmitted through the resonant signal section to the antenna to be radiated therefrom and to cause interference in receivers in the vicinity. Further, it is difficult to obtain "tracking" between the oscillator section and the signal section.

It has heretofore been proposed to use an amplifier stage in advance of the mixer to increase selectivity and increase image rejection, and such has been the practice with lower frequency tuners. However, in the frequencies under consideration, the use of electronic tubes or the like like amplifying devices poses special problems for various reasons including stability and the fact that the electron transit time becomes very important.

It has also been proposed to use a multiplicity of resonant circuits tuned to the signal frequency to increase selectivity, such resonant circuits being connected in series or cascade with no power amplification. While such an arrangement can increase selectivity to the extent that image signals are effectively rejected, the provision of the plurality of circuits introduces losses, attenuates the signal and decreases the signal-noise ratio, the signal-noise ratio being the ratio of the intensity of the desired signal at the output of the tuner relative to the intensity of signals produced from inherent random variations or vibrations in the mixer and associated circuit components.

Further, it is desirable that frequency components of a signal lying in the pass band (usually about 6 megacycles wide for television) should be uniformly amplified. In order to achieve such a characteristic with cascade-connected resonant circuits, it is essential that the circuits be tuned to exactly the same frequency and that there be a certain amount of coupling between circuits, which certain amount is generally known as the "critical" coupling. Accordingly, it is essential that accurate tracking be obtained between the circuits.

It may further be noted that over a band of frequencies in the range under consideration, it is very difficult in practice to eliminate standing waves in the antenna system including the antenna itself and the transmission line from the antenna to the tuner. Accordingly, the antenna system forms a resonant circuit and when this circuit is connected in series with two or more resonant circuits, with or without amplification, certain frequencies in the pass band may be greatly amplified and other frequencies greatly attenuated with only a slight deviation in the tuning of the circuits from the optimum tuning. Thus with any system using a plurality of resonant circuits in cascade, it becomes essential that extremely accurate tracking be obtained, and it will be readily appreciated that it is very difficult to obtain such tracking in the high frequency range under consideration, particularly over the UHF television band from 470–890 megacycles.

According to an important feature of this invention, a resonant circuit, which is hereinafter referred to as a "trap" circuit, is tuned in synchronism with the resonant signal circuit and the oscillator to a frequency equal to the image frequency and is arranged to absorb energy at that frequency from the resonant signal circuit. This arrangement virtually eliminates signals at the image frequency which, as pointed out above, become very troublesome at the high frequencies under consideration. However, this arrangement does not require an amplifier nor does it decrease the sensitivity or the signal-noise ratio as would happen with a plurality of resonant circuits connected in series. Further, the trap circuit need not be highly selective, the tuning thereof is not critical as is the case with arrangements using a plurality of resonant circuits in cascade, and the problems involved with tracking are minimized.

In addition, the trap circuit is arranged to attenuate the signal passing from the oscillator through the signal circuit and greatly reduce radiation from the antenna at the oscillator frequency, while allowing the signal from the oscillator to beat with the input signal to produce the intermediate frequency. Still further, this arrangement is very simple and the tuner embodying this arrangement may be readily manufactured, as will appear more clearly as this specification proceeds.

It might be noted that the concept of using a trap circuit tuned to the image frequency has been heretofore considered with reference to comparatively low frequency tuners but, as will be clear from the foregoing, the outstanding advantages achieved from this arrangement are obtained only when embodied in a tuner operating at the ultra high frequencies under consideration.

Other important features of the present invention reside in the physical construction of a tuner by which it is very efficient, stable and reliable in operation, and easily and economically manufacturable and adjustable by mass production techniques. It might at this point be noted that while certain of these features are particularly advantageous in combination with the arrangement above described utilizing the trap circuit tuned to the image frequency, these features are advantageous in and of themselves.

According to a specific feature of the invention, a tuner is enclosed within a sheet metal housing of rectangular box-like configuration with sheet metal partition means in the housing defining a resonant signal or input chamber and a resonant oscillator chamber in side-by-side relation. At the high frequency range of frequencies under consideration, an enclosed chamber having conductive walls may be comparatively small in size and define a resonant circuit. Such a chamber, being enclosed, is, of course, non-radiating. The rectangular configuration is, of course, advantageous in achieving ease of manufacture.

Most preferably, the partition means in the housing are apertured to provide the coupling between chambers, such apertures being sufficient to provide the sole coupling at the ultra high frequencies under consideration, and being readily provided, particularly with sheet metal partitions.

The tuner, of course, preferably embodies the trap circuit tuned to the image frequency which is highly advantageous as pointed out above. In the preferred construction, a first partition may be spaced from one side wall of the rectangular housing to define the signal chamber, and a second partition may be spaced from the first partition to define the trap section, the second partition being spaced from the other side wall of the housing to define the oscillator section. Such partitions may, of course, have apertures to establish coupling between the chambers.

A further specific feature of the present invention is in the construction of a resonant chamber to be readily tuned over a wide range of ultra high frequencies. According to this feature, the signal or input chamber, for example, may have an elongated stator plate projecting from one end wall thereof to a point spaced from the opposite end wall thereof with a tuning shaft projecting transversely from a side wall of said chamber adjacent the stator plate and with a rotor plate fixed to the shaft in closely spaced parallel capacitive relation to the stator plate, the adjacent areas of the plates being variable by rotation of the shaft to vary the capacitance therebetween and vary the resonant frequency of the chamber. With this arrangement, it has been found that the resonant frequency of the chamber may be varied over a wide range with a minimum number of plates. For example, it has been found that the signal chamber can be tuned over the entire UHF television band from 470–890 megacycles with a single stator plate rotated 180°. This, of course, is highly advantageous from a manufacturing standpoint, particularly in the fact that adjustment of tracking between such a chamber and other chambers involves only a single plate.

The trap chamber, if such is utilized, is preferably constructed in the same manner as the signal or input chamber and the same tuning shaft may project through the trap section with a rotor plate attached thereto so that gang tuning of the two chambers is achieved, and in a very simple arrangement.

It has been found that improved results are achieved with the tuning shaft projecting across an intermediate portion of the stator plate, so that the stator plate has a terminal end portion projecting beyond the shaft. This increases the tuning range. Further, a trimmer capacitor may be provided adjacent the end of the stator plate projecting beyond the tuning shaft, which trimmer capacitor may be defined by a plate secured to the bottom wall of the chamber and projecting upwardly adjacent the end of the stator plate.

It may be noted that the resonant chamber arrangement as above described may be considered somewhat analogous to a coaxial transmission line section with the side, bottom and top walls of the chamber defining the outer conductor and with the stator plate defining the inner conductor, the inner conductor being connected at one end to the outer conductors through the end wall of the chamber. Disregarding the capacitance between the rotor and stator plates, this transmission line section will be resonant at a frequency wherein the length of the stator plate is roughly equal to one-quarter wave length. As the capacitance is increased, the resonant frequency of the chamber is, of course, decreased.

The oscillator chamber may be constructed in the same manner as the input or signal chamber. Preferably, however, the oscillator chamber has a somewhat different construction. In particular, the oscillator circuit is preferably such that the plate of the oscillator tube, which is connected to a positive potential relative to the tuner housing, is connected to the stator plate and hence the stator plate is not connected to the housing. Instead, the stator plate is insulatingly supported within the oscillator chamber with its ends spaced from the end walls of the chamber. The oscillator tube socket is mounted at one end wall and the plate terminal of the socket is connected to the adjacent end of the stator plate through a lead wire. According to a specific feature of the invention, this lead wire may be formed into a hairpin configuration to increase inductance and provide a slight degree of adjustability of the inductance.

The tuning shaft for the input or signal chamber also projects through the oscillator chamber adjacent an intermediate point on the stator plate and a rotary plate may be mounted on the shaft to coact with the stator plate in the oscillator chamber to provide a variable capacitance. While satisfactory results can be achieved with one rotor plate, it has been found preferable to use two rotor plates, one on each side of the stator plate. In particular, it has been found possible to achieve a much higher degree of linearity with the two plates and the effort required in alignment is greatly reduced.

According to a further specific feature, the stator plate of the oscillator section is coated with a thin layer of glass or a like insulating dielectric material which protects against shorts between the rotor plates which are at ground potential and the stator plate which is at a high positive potential. Further, the layer of glass increases to a slight extent the dielectric constant between the rotor plates and the stator plate and hence it is possible to achieve a greater change in capacitance with rotation of the rotor plates.

For adjustment of the tuning of the oscillator section, the wire or hairpin configuration may be adjusted as above described. Also, a trimmer capacitor may be provided which is preferably defined by a plate carried at the end of a screw threaded in the side wall of the housing, the screw being rotatable to adjust the spacing between the plate and the stator plate.

The oscillator circuit most preferably employed is of the grounded grid type with the grid connected through a grid-leak capacitor and resistor combination to ground and with the cathode above ground and connected to ground through a R. F. choke. This circuit is highly advantageous because it is very stable and reliable in operation.

In accordance with other specific features of the invention, the input or signal section is coupled to a mixer, which may preferably be a suitable crystal, through a conductor connected to a point on the stator plate of the signal section and extending through an opening in the rear wall of the signal chamber. The antenna is also coupled to the signal chamber preferably through a two conductor balanced transmission line with each conductor terminated in a loop inside the signal chamber.

The physical construction of the tuner as above described has been found to be highly advantageous, particularly in that only one rotor plate is required in the signal and trap sections and only two required in the oscillator section, and such rotor plates can be shaped in a manner such that the frequency of tuning will vary linearly with respect to the angular rotation of the tuning shaft. Thus the tuner is readily constructed and tracking between the sections can be obtained as readily as possible. Fine adjustments of the tracking can, of course, be achieved through adjustment of the trimmer capacitances and, if desired, even finer adjustment can be achieved through bending peripheral portions of the rotor plates, which may be appropriately notched for this purpose.

The feature in which the trap section is tuned to the image frequency is, of course, highly advantageous in itself as pointed out in detail above and is also an advantage in combination with the particular physical construction of the tuner since tracking problems are thereby minimized.

An object of this invention, accordingly, is to provide a high frequency tuner having a physical construction by which it is very efficient, stable and reliable in operation and easily and economically manufacturable and adjustable by mass production techniques.

Another object of this invention is to provide an improved ultra high frequency tuner utilizing a trap section tuned to the image frequency.

Figure 2:
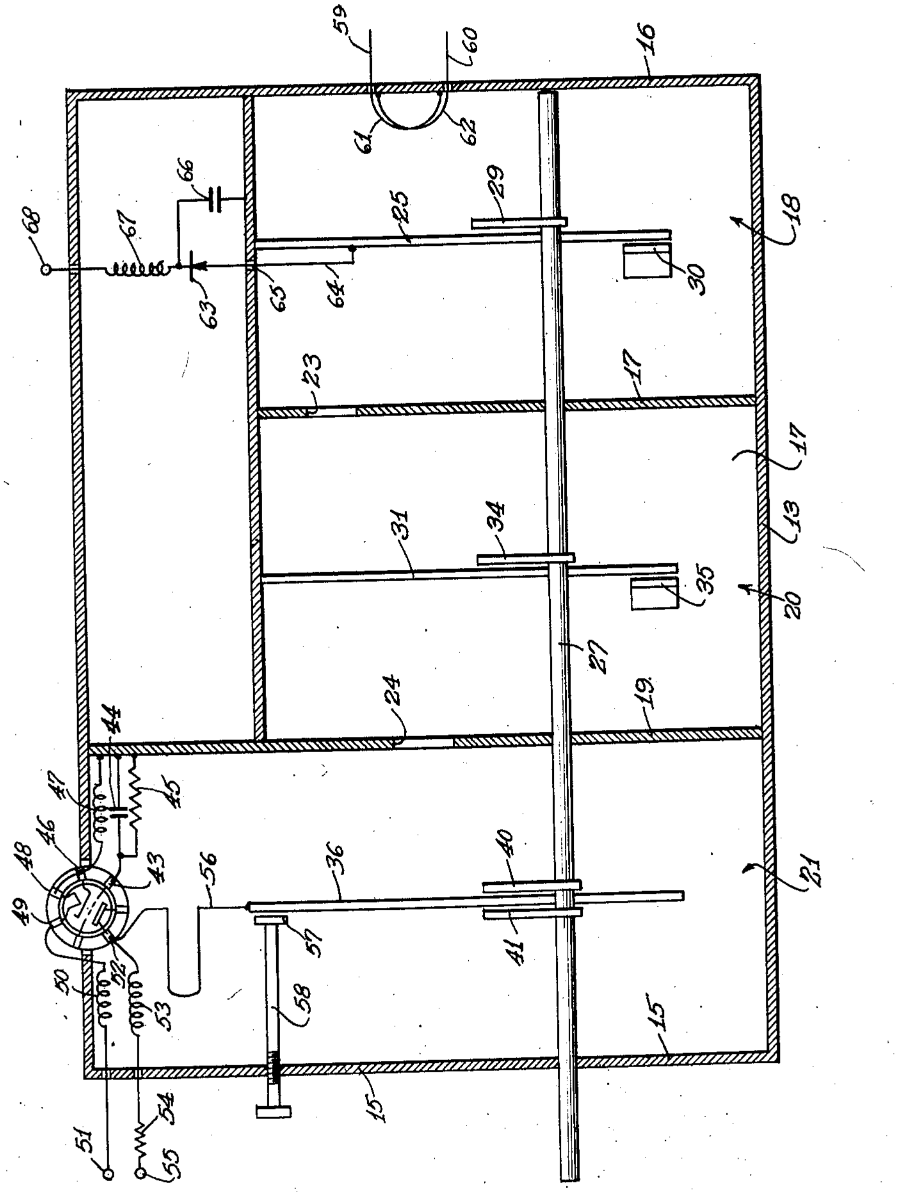

This invention contemplates other objects, features and advantages which will become more fully apparent from the following detailed description taken in conjunction with the accompanying drawings which illustrate a preferred embodiment and in which:

Figure 1 is a perspective view illustrating the general construction of a tuner constructed in accordance with the principles of the present invention, the top and front walls of the tuner housing being broken away to show the internal construction; and Figure 2 is a diagrammatic view illustratig certain cercuits and features not shown in Figure 1.

Reference numeral 10 generally designates an ultra high frequency tuner constructed according to the principles of this invention which may comprise a sheet metal housing of generally rectangular box-like configuration including a bottom wall 11, a top wall 12, a front wall 13, a rear wall 14 and side walls 15 and 16. A sheet metal partition 17 is spaced laterally from the right-hand wall 16 to define an input or signal resonant chamber generally designated by reference numeral 18. A second sheet metal partition 19 is spaced laterally from the partition 17 to define a trap chamber generally designated by reference numeral 20, the partition 19 being also spaced from the left-hand side wall 15 to define an oscillator chamber generally designated by reference numeral 21. It is desirable that the input or signal chamber 18 and the trap section 20 should have a length somewhat less than the oscillator chamber 21 and for this reason, a third partition member 22 may be spaced forwardly from the rearward end wall 14 of the housing between the partition 19 and the right-hand side wall 16 to define a rearward end wall for the signal section 18 and the trap section 20.

Suitable coupling between the chambers 18, 20 and 21 is provided by means of generally rectangular apertures 23 and 24 in the partitions 17 and 19, respectively.

To resonate the input or signal chamber 18, an elongated stator plate 25 is disposed centrally therewithin and projects forwardly from the partition 22 defining the rear end wall of the chamber 18 to a point spaced from the front end wall 13. The stator plate 25 may be supported adjacent its forward end by a post 26 of a suitable dielectric material which has its lower end adhesively secured to the bottom 11 with its upper end notched to receive the stator plate 25.

A tuning shaft 27 projects transversely through the chambers 21, 20 and 18 and extends adjacent an intermediate portion of the stator plate 25. Preferably, the stator plate 25 may be notched at 28 to receive the shaft 27. A rotor plate 29 is fixed to the shaft 27 in closely spaced parallel capacitive relation to the stator plate 25, the facing areas of the stator plate 25 and the rotor plate 29 being adjustable by rotation of the tuning shaft 27. With the construction as described, it is possible to obtain linearity of the frequency of tuning of the chamber 18 relative to the angular rotation of the shaft 27 over a wide range of frequencies. In particular, it has been found possible to obtain such linearity over the UHF television band from 470–890 megacycles with 180° rotation of the tuning shaft 27.

For precise adjustment of the signal chamber 18, a trimmer capacitor is provided in the form of a generally L-shaped plate 30 having a horizontal leg secured to the bottom 11 and a vertical leg extending adjacent the forward end of the stator plate 25, the capacitance being variable by bending the member 30 laterally toward or away from the stator plate 25.

The trap chamber 20 is resonated by means like that used in the signal chamber 18 and includes a stator plate 31 having a notch 32 and supported by a post 33, a rotor plate 34 secured to the shaft 27, and a trimmer capacitor member 35.

The oscillator chamber 21 may likewise be resonated by structure like that used to resonate the signal or input chamber 18. Preferably, however, a slightly different construction is utilized. In particular, an elongated stator plate 36 is supported within the chamber 21 by means of posts 37 and 38 of an insulating dielectric material, the tuning shaft 27 extending across an intermediate portion of the stator plate 36 with the stator plate 36 being notched at 39 for this purpose. A pair of rotor plates 40 and 41 are carried by the tuning shaft 27 on either side of the stator plate 36 to vary the frequency of tuning of the chamber 21 as the shaft 27 is rotated. It would be possbile to use only one rotor plate for tuning of the oscillator chamber 21, as is the case with the signal chamber 18 and the trap chamber 20. However, it has been found that in practice it is much easier to obtain linearity between angular rotation of the shaft 27 and the frequency of tuning of the oscillaotr chamber 21 when two plates are used and hence adjustment of the tuner to obtain tracking is greatly simplified.

It will be appreciated by those skilled in the art that many different types of oscillator circuits could be used in conjunction with the resonant chamber 21. According to this invention, a grounded grid oscillator circuit is used, which circuit has been found to be very stable and reliable in practice. This circuit utilizes a triode vacuum tube which may preferably be a type 6AF4 inserted in a suitable socket 42 mounted in the rearward end wall 14 of the housing.

As indicated in Figure 2, the grid of this tube is connected to a terminal 43 which may be connected through a grid-leak capacitor 44 and a grid-leak resistor 45 to ground, that is, the housing. The cathode is connected to a terminal 46 which is connected through a R. F. choke 47 to ground. The opposite ends of the heater are connected to terminals 48 and 49. To minimize the effect of the cathode to heater capacity, the heater terminal 48 may be connected to the cathode terminal 46 with the other heater terminal 49 connected through a R. F. choke 50 to a terminal 51. The heater supply voltage may be applied between the terminal 51 and the housing.

The plate of the oscillator tube is connected to a terminal 52 which is connected through a R. F. choke 53 and a resistor 54 to a terminal 55 which may be connected to the positive side of a D.-C. plate supply, the other side of the plate supply being connected to the housing of the tuner. The plate terminal 52 is also connected through a wire 56 to the rearward end of the stator plate 36. According to a specific feature of the invention, this wire 56 is bent into a generally U-shaped hairpin configuration to increase inductance and to permit accurate adjustment of the inductance through bending the wire 56.

For further adjustment of the tuning of the oscillator chamber 21, a plate 57 disposed adjacent the rearward end portion of the stator plate 36 is carried by an adjustment screw 58 threaded into the left-hand side wall 15 of the housing.

The signal from the oscillator chamber 21 is coupled to the signal chamber 18 through the openings 24 and 23 in the partitions 19 and 17, respectively. The signal chamber 18 may be coupled to a balanced antenna line including conductors 59 and 60 by loops 61 and 62 forming continuations thereof and disposed in the chamber 18. The signal chamber 18 is also coupled to one terminal of a mixer crystal 63 through a conductor 64 connected to a point on the stator plate 25 spaced from the partition 22, the conductor 64 extending through an opening 65 in the partition 22 to the crystal 63. The other terminal of the crystal 63 may be connected through a bypass capacitor 66 to ground and through a R.-F. choke 67 to a terminal 68 which may be connected to a suitable I. F. amplifier.

It may be here noted that terms such as horizontal, vertical, front, rear, side, end, and the like are used herein only for ease, conciseness and clarity of description and reference and are not to be construed as limitations.

It will further be understood that modifications and variations may be effected without departing from the spirit and scope of the novel concepts of the present invention.

I claim as my invention:

1. In an ultra high frequency tuner, wall means defining a chamber having side walls and end walls, a plate supported in said chamber and having one end spaced from one end wall thereof, a terminal supported in said end wall, and a wire of generally U-shaped configuration disposed between said terminal and said one end of said plate and defining an adjustable inductance.

2. In an ultra high frequency tuner, a rectangular housing of conductive material, a first partition of conductive material wtihin said housing and spaced from one side wall thereof to define a signal chamber, a second partition of conductive material spaced from said first partition to define a trap section and spaced from the other side wall of said housing to define an oscillator section, an oscillator coupled to said oscillator chamber, a mixer coupled to said signal chamber, a manually adjustable member, tuning means in each of said chambers mechanically coupled to said member and arranged to maintain the frequency of tuning of said trap section equal to twice the frequency of tuning of said oscillator chamber less the frequency of tuning of said signal chamber over a range of frequencies, said partitions being apertured to provide coupling between said chambers.

References Cited in the file of this patent

UNITED STATES PATENTS

| | | |
|---|---|---|
| 1,533,611 | Respess | Apr. 14, 1925 |
| 1,896,065 | Budenbom | Feb. 7, 1933 |
| 2,038,879 | Willans | Apr. 28, 1936 |
| 2,311,522 | Conron et al. | Feb. 16, 1943 |
| 2,460,109 | Southworth | Jan. 25, 1949 |
| 2,558,482 | Galitz | June 26, 1951 |
| 2,572,880 | Riebman | Oct. 30, 1951 |
| 2,573,460 | Lindenblad | Oct. 30 ,1951 |
| 2,638,544 | Schreiner | May 12, 1953 |